United States Patent [19]

Jeong

[11] Patent Number: 5,237,326
[45] Date of Patent: Aug. 17, 1993

[54] FLASH TYPE ANALOG-TO-DIGITAL CONVERTER HAVING MOS COMPARATORS

[75] Inventor: Ho-sun Jeong, Taegu, Rep. of Korea

[73] Assignee: Samsung Electronics Co., Ltd., Kyunggi-do, Rep. of Korea

[21] Appl. No.: 879,691

[22] Filed: May 4, 1992

Related U.S. Application Data

[63] Continuation of Ser. No. 473,634, Feb. 1, 1990, abandoned.

[30] Foreign Application Priority Data

Feb. 2, 1989 [KR] Rep. of Korea ............ 89-1372

[51] Int. Cl.$^5$ ........................................... H03M 1/36
[52] U.S. Cl. .................................... 341/160; 341/159
[58] Field of Search ............ 341/160, 159, 158, 155; 307/355; 357/23.12

[56] References Cited

U.S. PATENT DOCUMENTS

| | | | |
|---|---|---|---|
| 4,323,887 | 4/1982 | Buurma | 341/136 |
| 4,600,916 | 7/1986 | Masuda et al. | 341/159 |
| 4,639,715 | 1/1987 | Doluca | 341/159 |
| 4,745,393 | 5/1988 | Tsukada et al. | 341/159 |
| 4,872,010 | 10/1989 | Larson et al. | 341/134 |
| 4,899,154 | 2/1990 | Colles | 341/136 |
| 4,918,451 | 4/1990 | Ando et al. | 341/159 |
| 4,924,227 | 5/1990 | Mangelsdorf | 341/159 |
| 4,928,103 | 5/1990 | Lane | 341/160 |
| 4,933,902 | 7/1990 | Yamada et al. | 365/189.08 |
| 4,958,157 | 9/1990 | Miki et al. | 341/159 |
| 4,965,579 | 10/1990 | Liu et al. | 341/158 |
| 4,970,513 | 11/1990 | Yoshii | 341/158 |
| 4,983,968 | 1/1991 | Nguyen et al. | 341/159 |

Primary Examiner—A. D. Pellinen
Assistant Examiner—Brian K. Young
Attorney, Agent, or Firm—Cushman, Darby & Cushman

[57] ABSTRACT

A flash type ADC (analog-to-digital converter) for converting analog signals to N-bit digital signals comprises $2^N - 1$ comparators having different threshold values in a sequential order which perform full parallel-connected comparison. Buffer-amplifiers buffer the outputs of the respective comparators and a priority encoder encodes the outputs of the comparators. According to the present invention, the conventional reference resistance row is eliminated, and instead, comparators are used, resulting in simplified circuitry, improved conversion speed, and facilitated VLSI formation.

7 Claims, 2 Drawing Sheets

FLASH TYPE ANALOG-TO-DIGITAL CONVERTER HAVING MOS COMPARATORS

This is a continuation of application Ser. No. 07/473,634, filed on Feb. 1, 1990, which was abandoned upon the filing hereof.

FIELD OF THE INVENTION

The present invention relates to an analog-to-digital converter (to be called hereinafter "ADC"), and particularly to a full parallel connected flash type ADC.

BACKGROUND OF THE INVENTION

The data which computers can process are digital values, while the data used by humans are mostly analog values. Therefore, if the data used by humans are to be processed by computers, the data must be necessarily converted to digital values.

The ADC for converting analogue values to digital values has been developed in various typed depending on the application fields. The converting methods of the ADC can be classified into two types, i.e., an integration type and a comparison method, and the former is further classified into a voltage-time conversion type and voltage-frequency conversion type, while the comparison type is further classified into a feedback comparison type and a non-feedback comparison type. (1. Eugen R. Hentek, "A User's Handbook of D/A and A/D converter", DCA Reliability Laboratory Inc., 2. David P. Hoeschele, Jr., John Wiley & Sons, "Analogue to Digital/Digital to Analogue Conversion Techniques".)

The comparison type is very fast in its conversion speed compared with the integration type, and is applicable to fields such as video signal processings in which high conversion speeds are required. The full parallel-connected comparison type (flash type) ADC basically comprises a reference resistance row, voltage comparators, and an encoder. However, in forming such components into an integrated circuit, there are a number of drawbacks, such as an increase in chip area due to the existence of the resistance row, relatively large power consumption, a decrease in the operation speed, and the like.

SUMMARY OF THE INVENTION

It is an object of this present invention to provide an ADC in which the constitution of the circuits is simplified, and the conversion speed is improved.

It is another object of the present invention to provide an ADC in which a MOS transistor is sued in place of the reference resistance row so that a VLSI formation is facilitated.

In achieving the above objects, the ADC for converting analog signals to Nbit digital signals according to the present invention comprises:

comparators having different threshold values in a sequential order, for performing full parallel-connected comparison after receipt of analog signals;

buffer-amplifiers for buffering the outputs of the respective comparators; and a priority encoder for outputting Nbit digital outputs after performing priorty encodings on the outputs of the comparators, through the buffer-amplifiers.

The above mentioned comparators consist of PMOS and NMOS transistors respectively, and are designed to have different threshold values in a sequential manner based on the conductance ratio of the tow transistors, while the priority encoder consists of a combination of PMOS and NMOS transistors.

Thus, according to the present invention, the reference resistance row is eliminated, and the comparators in which the threshold values are set based on the conductance ratio of the PMOS and NMOS transistors compare the analog signals through full parallel-connected comparisons. Then, based on the result of the comparison, encodings are carried out by means of the priority encoder which consists of a combination of PMOS and NMOS transistors. Therefore, the ADC according to the present invention provides a simple circuitry constitution compared with the conventional reference resistance type ADC, a and faster conversion speed.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENT

Figure 1:
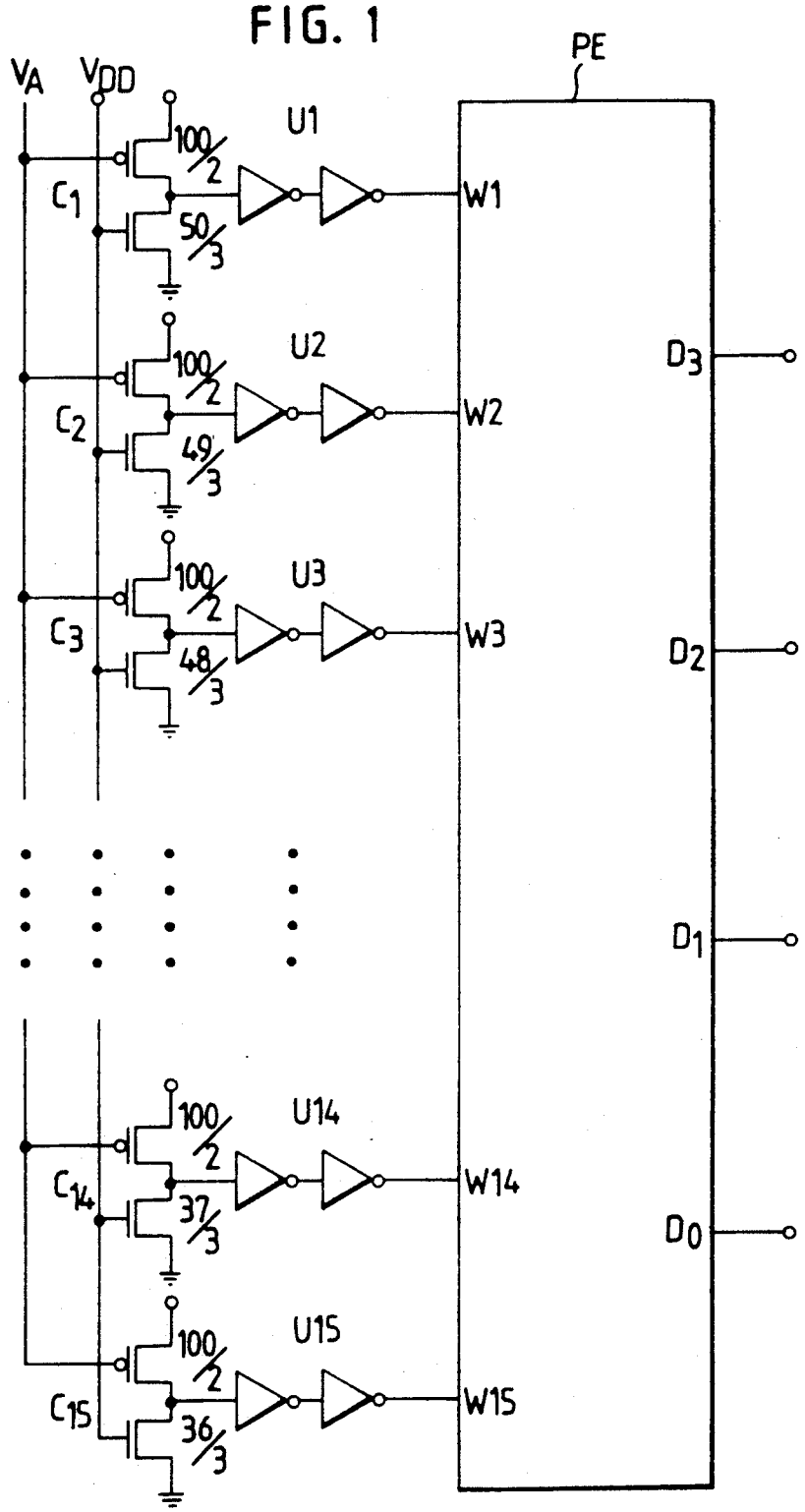
FIG. 1 is a circuit diagram of a 16 to 4-flash type ADC according to the present invention.

In FIG. 1, the ADC of an embodiment according to the present invention comprises a section consisting of comparators C1–C15 having 15 different threshold values in a sequential manner and for performing comparisons after receipt of analog signals, a section for buffering the outputs of the comparators, and a section for outputting 4-bit digital signals after performing priority encodings for the outputs of the respective comparators C1–C15.

The respective comparators C1–C15 constituting the comparing section consist of a PMOS transistor and an NMOS transistor and the PMOS transistor has a gate electrode coupled to receive analog signals VA, and a source electrode coupled to a first power source voltage VDD. The NMOS transistor has a gate electrode coupled to the first power source voltage VDD, and a source electrode coupled to a second power source voltage (ground).

The drain electrodes of the PMOS and NMOS transistors are commonly connected to define output node of the comparators, and the comparators have threshold values set in accordance with the ratios of the conductances of the respective PMOS and NMOS transistors. The conductance ratios of the respective MOS transistors are set during the manufacturing process based on the ratio of the geometrical aspect ratio W/L of the MOS transistors, i.e., based on the ratio of channel width/channel length.

In the preferred embodiment of the present invention, the conductance ratio of the PMOS transistor is fixed to a constant ratio, e.g., to 100 $\mu$m/2 $\mu$m, while the conductance ratios of the NMOS transistor are assigned in 15 steps in a sequential manner from 50 $\mu$m/3 $\mu$m to 36 $\mu$m3 $\mu$m. Accordingly, the ratio for the first comparator C1 is 100/2:50/3, i.e., about 3:1, and if the mobility of the hole to the electron is assumed to the 1:3, the conductance ratio becomes about 1:1, with the result that the threshold value becomes about 2.5 V assuming that the first power source voltage VDD is 5 V. Based on such a principle, the threshold value for the 15th comparator C15 will be about 4.0 V.

Accordingly, as the values of the analog signals VA supplied to the gate electrode of the PMOS transistors are increased to e.g., 0 V-1.5 V, the outputs of the comparators C1-C15 will be successively shifted from "1" to "0" until all the outputs of all the comparators C1-C15 are shifted to "0" at 1.5 V of the analog value.

The outputs of the comparators C1-C15 are buffered by means of the corresponding buffer-amplifiers U1-U15, and then, the buffered outputs are supplied to the input terminals W1-W15 of the priority encoder PE, respectively. The buffer-amplifiers U1-U15 consist of serially connected two CMOS inverters.

Figure 2:
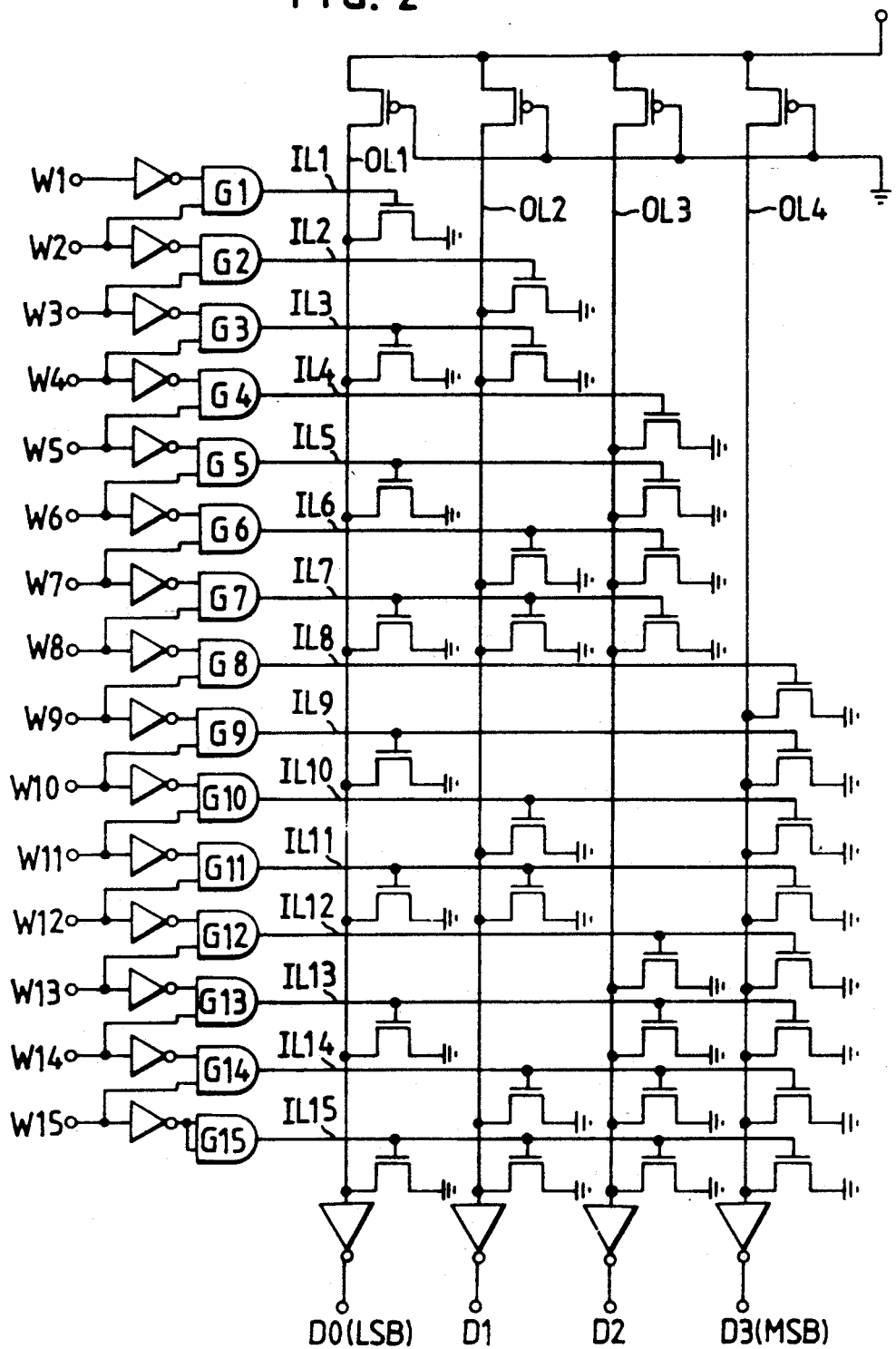
FIG. 2 is a detailed circuit diagram of the priority encoder of FIG. 2.

As shown in FIG. 2, the priority encoder PE comprises output lines OL1-OL4 (in the number of N, corresponding to the N-bit ADC) coupled to the first power source voltage VDD through PMOS transistors. The opposite ends of output lines OL1-OL14 are connected through inverters to output terminals D0-D3, respectively. Input lines IL1-IL15 (in the number of $2^4-1=15$) cross the output lines OL1-OL4. Gate means consisting of 15 inverters and 15 AND gates G1-G15 respectively gates the inverted outputs of the comparators to the relevant ones of the input lines IL1-IL15 in accordance with the output of the next comparator. NMOS transistors are disposed at the intersection points of the output lines OL1-OL4 and the input lines IL1-IL4 where a "1" is given, among any bit the of 4 bit binary digit.

In each of these NMOS transistors, the gate electrode is connected to an input line, the drain electrode is connected to an output line, and the source electrode receives the second power source voltage (ground). Therefore, if the first comparator C1 is shifted from "1" to "0", "0" is supplied to the input terminal W1 and "1" is supplied to the input terminal W2 of the encoder PE. As a result, both inputs for the first AND gate G1 become "1" causing the NMOS transistor connected to the first input terminal IL1 to turn on.

Thereupon, the potential of the output line OL1 is shifted down to the ground level, and therefore, the output terminal D0 will output "1", with the result that the 4-bit output of the encoder PD becomes 0001. Based on this principle, the outputs of the priority encoder PE which will vary as against the variation of the analog inputs VA from 0 V to 1.5 V can be summarized as shown in the following table 1.

comparators are used in which the threshold values are set in accordance with the conductance ratio of the PMOS and NMOS transistors, while the priority of the comparators is outputted in a digital form by means of a priority encoder which combines PMOS and NMOS transistors. This brings the result that the circuits are simplified, the conversion speed is improved, and the VLSI formation is facilitated.

What is claimed is:

1. A flash type analog-to-digital converter for converting an analog signal to an N-bit digital signal, comprising:

$2^N-1$ comparator means coupled in a parallel sequence of weighted transistor threshold ratio, each comparator means synchronously receiving the analog signal and generating a weighted comparator output signal in response thereto, wherein the weighted transistor threshold ratio is a function of a predetermined conductance ratio of a PMOS transistor and an NMOS transistor connected in series and uniquely included in each one of said $2^N-1$ comparator means;

$2^N-1$ buffer-amplifiers for buffering the respective weighted comparator output signals from the corresponding ones of said $2^N-1$ comparators means; and a priority encoder for performing priority based encodings comprising:

$2^N-1$ gate means, coupled at respective first gate inputs to the corresponding outputs of said $2^N-1$ buffer amplifiers, and coupled at respective second gate inputs to the respective outputs of said $2^N-1$ buffer amplifiers which are next in the parallel sequence of weighted comparator output signals;

$2^N-1$ input lines coupled to the corresponding outputs of said $2^N-1$ gate means;

N output lines intersecting said input lines and having first and second ends;

N PMOS transistors coupled to corresponding first ends of said N output lines and supplying said output lines with a first power source voltage;

a plurality of NMOS transistors disposed at selected intersections of said N output lines and said $2^N-1$ input lines for operatively changing the voltage bias on each respective output lines in response to the outputs on said input lines coupled from said gate means; and

TABLE 1

| VA | order | W1 | W2 | W3 | W4 | W5 | W6 | W7 | W8 | W9 | W10 | W11 | W12 | W13 | W14 | W15 | D0 | D1 | D2 | D3 |
|---|---|---|---|---|---|---|---|---|---|---|---|---|---|---|---|---|---|---|---|---|
| 0   | 0  | 1 | 1 | 1 | 1 | 1 | 1 | 1 | 1 | 1 | 1 | 1 | 1 | 1 | 1 | 1 | 0 | 0 | 0 | 0 |
| 0.1 | 1  | 0 | 1 | 1 | 1 | 1 | 1 | 1 | 1 | 1 | 1 | 1 | 1 | 1 | 1 | 1 | 1 | 0 | 0 | 0 |
| 0.2 | 2  | 0 | 0 | 1 | 1 | 1 | 1 | 1 | 1 | 1 | 1 | 1 | 1 | 1 | 1 | 1 | 0 | 1 | 0 | 0 |
| 0.3 | 3  | 0 | 0 | 0 | 1 | 1 | 1 | 1 | 1 | 1 | 1 | 1 | 1 | 1 | 1 | 1 | 1 | 1 | 0 | 0 |
| 0.4 | 4  | 0 | 0 | 0 | 0 | 1 | 1 | 1 | 1 | 1 | 1 | 1 | 1 | 1 | 1 | 1 | 0 | 0 | 1 | 0 |
| 0.5 | 5  | 0 | 0 | 0 | 0 | 0 | 1 | 1 | 1 | 1 | 1 | 1 | 1 | 1 | 1 | 1 | 1 | 0 | 1 | 0 |
| 0.6 | 6  | 0 | 0 | 0 | 0 | 0 | 0 | 1 | 1 | 1 | 1 | 1 | 1 | 1 | 1 | 1 | 0 | 1 | 1 | 0 |
| 0.7 | 7  | 0 | 0 | 0 | 0 | 0 | 0 | 0 | 1 | 1 | 1 | 1 | 1 | 1 | 1 | 1 | 1 | 1 | 1 | 0 |
| 0.8 | 8  | 0 | 0 | 0 | 0 | 0 | 0 | 0 | 0 | 1 | 1 | 1 | 1 | 1 | 1 | 1 | 0 | 0 | 0 | 1 |
| 0.9 | 9  | 0 | 0 | 0 | 0 | 0 | 0 | 0 | 0 | 0 | 1 | 1 | 1 | 1 | 1 | 1 | 1 | 0 | 0 | 1 |
| 1.0 | 10 | 0 | 0 | 0 | 0 | 0 | 0 | 0 | 0 | 0 | 0 | 1 | 1 | 1 | 1 | 1 | 0 | 1 | 0 | 1 |
| 1.1 | 11 | 0 | 0 | 0 | 0 | 0 | 0 | 0 | 0 | 0 | 0 | 0 | 1 | 1 | 1 | 1 | 1 | 1 | 0 | 1 |
| 1.2 | 12 | 0 | 0 | 0 | 0 | 0 | 0 | 0 | 0 | 0 | 0 | 0 | 0 | 1 | 1 | 1 | 0 | 0 | 1 | 1 |
| 1.3 | 13 | 0 | 0 | 0 | 0 | 0 | 0 | 0 | 0 | 0 | 0 | 0 | 0 | 0 | 1 | 1 | 1 | 0 | 1 | 1 |
| 1.4 | 14 | 0 | 0 | 0 | 0 | 0 | 0 | 0 | 0 | 0 | 0 | 0 | 0 | 0 | 0 | 1 | 0 | 1 | 1 | 1 |
| 1.5 | 15 | 0 | 0 | 0 | 0 | 0 | 0 | 0 | 0 | 0 | 0 | 0 | 0 | 0 | 0 | 0 | 1 | 1 | 1 | 1 |

As described above, according to the present invention, the reference resistance row of the conventional full parallel connection type ADC is eliminated, and N inverters coupled to said second ends of said output lines for generating the N-bit digital signal in response to the respectively sensed voltage bias from each corresponding output line.

2. A flash type analog-to-digital converter as in claim 1, wherein the predetermined conductance ratio of each one of said $2^N-1$ comparator means is set by fixing the conductance of all PMOS therein to a constant value, and varying the conductance ratio of each NMOS transistor in accordance with its position in the parallel sequence resulting in the weighted transistor threshold ratio.

3. A flash type analog-to-digital converter as in claim 1, wherein each of said $2^N-1$ buffer amplifiers comprises two series connected CMOS inverters.

4. A flash type analog-to-digital converter for converting an analog signal to an N-bit digital signal, comprising:

$2^N-1$ comparator means coupled in a parallel sequence of weighted transistor threshold ratio, each comparator means synchronously receiving the analog signal and generating a weighted comparator output signal in response thereto, wherein the weighted transistor threshold ratio is a function of a predetermined conductance ratio of a PMOS transistor and an NMOS transistor connected in series and uniquely included in each corresponding one of said comparator means, wherein each PMOS transistor includes a drain, a gate for receiving the analog signal, and a source for receiving a first power source voltage, and each NMOS transistor includes a drain connected to the drain of the PMOS transistor and providing the weighted comparator output signal associated therewith, a gate for receiving said first power source voltage, and a source for receiving a second power source voltage;

$2^N-1$ buffer-amplifiers for receiving, amplifying, and buffering the respective weighted comparator output signals from the corresponding ones of said $2^N-1$ comparators means; and a priority encoder for receiving the buffered outputs from said $2^N-1$ buffer amplifiers, performing priority-based encodings in response thereto and generating an N-bit digital signal.

5. A flash type analog-to-digital converter as in claim 4, wherein the predetermined conductance ratio of each one of said $2^N-1$ comparator means is set by fixing the conductance of all PMOS therein to a constant value, and varying the conductance ratio of each NMOS transistor in accordance with its position in the parallel sequence resulting in the weighted transistor threshold ratio.

6. A flash type analog-to-digital converter as in claim 4, wherein each of said $2^N-1$ buffer amplifiers comprises two series connected CMOS inverters.

7. A flash type analog-to-digital converter as in claim 4, wherein said priority encoder comprises:

$2^N-1$ gate means, coupled at respective first gate inputs to the corresponding outputs of said $2^N-1$ buffer amplifiers, and coupled at respective second gate inputs to the respective outputs of said $2^N-1$ buffer amplifiers which are next in the parallel sequence of weighted comparator output signals;

$2^N-1$ input lines coupled to the corresponding outputs of said $2^N-1$ gate means;

N output lines intersecting said input lines and having first and second ends;

N PMOS transistors coupled to corresponding first ends of said N output lines and supplying said output lines with a first power source voltage;

a plurality of NMOS transistors disposed at selected intersections of said N output lines and said $2^N-1$ input lines for operatively changing the voltage bias on each respective output lines in response to the outputs on said input lines coupled from said gate means; and N inverters coupled to said second ends of said output lines for generating the N-bit digital signal in response to the respectively sensed voltage bias from each corresponding output line.

* * * * *